United States Patent
Cai et al.

(10) Patent No.: US 11,930,696 B2
(45) Date of Patent: Mar. 12, 2024

(54) FABRICATION METHOD OF A DOUBLE-GATE CARBON NANOTUBE TRANSISTOR

(71) Applicant: Taiwan Semiconductor Manufacturing Co., Ltd., Hsinchu (TW)

(72) Inventors: Jin Cai, Hsinchu (TW); Sheng-Kai Su, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 83 days.

(21) Appl. No.: 17/308,635

(22) Filed: May 5, 2021

(65) Prior Publication Data

US 2022/0302389 A1 Sep. 22, 2022

Related U.S. Application Data

(60) Provisional application No. 63/162,672, filed on Mar. 18, 2021.

(51) Int. Cl.
  *H10K 85/20* (2023.01)
  *H01L 21/02* (2006.01)
  *H01L 29/06* (2006.01)
  *H10K 10/46* (2023.01)

(52) U.S. Cl.
  CPC ..... *H10K 85/221* (2023.02); *H01L 21/02606* (2013.01); *H01L 29/0673* (2013.01); *H10K 10/472* (2023.02); *H10K 10/474* (2023.02); *H10K 10/484* (2023.02)

(58) Field of Classification Search
  CPC .......... H01L 21/02606; H01L 29/0669; H01L 29/0673; H01L 51/0048; H01L 51/0525; H01L 51/0529; H01L 51/0554; H01L 51/0558; H01L 51/057; H10K 10/472;
  (Continued)

(56) References Cited

U.S. PATENT DOCUMENTS

| 8,900,951 B1 * | 12/2014 | Cheng ................... H01L 29/495 257/E21.453 |
| 10,522,682 B2 | 12/2019 | Yoon et al. |
| 10,943,833 B2 | 3/2021 | Chiang et al. |

(Continued)

FOREIGN PATENT DOCUMENTS

| DE | 102019124233 A1 | 3/2021 |
| KR | 20150021448 A | 3/2015 |

(Continued)

*Primary Examiner* — Yara B Green
*Assistant Examiner* — Christopher M Roland
(74) *Attorney, Agent, or Firm* — Slater Matsil, LLP

(57) ABSTRACT

A method includes depositing a dielectric layer over a substrate, forming carbon nanotubes on the dielectric layer, forming a dummy gate stack on the carbon nanotubes, forming gate spacers on opposing sides of the dummy gate stack, and removing the dummy gate stack to form a trench between the gate spacers. The carbon nanotubes are exposed to the trench. The method further includes etching a portion of the dielectric layer underlying the carbon nanotubes, with the carbon nanotubes being suspended, forming a replacement gate dielectric surrounding the carbon nanotubes, and forming a gate electrode surrounding the replacement gate dielectric.

20 Claims, 20 Drawing Sheets

(58) Field of Classification Search
CPC ... H10K 10/474; H10K 10/484; H10K 85/221
See application file for complete search history.

(56) References Cited

U.S. PATENT DOCUMENTS

| | | |
|---|---|---|
| 11,165,032 B2 | 11/2021 | Doornobs et al. |
| 11,437,594 B2 | 9/2022 | Vasen et al. |
| 2009/0061572 A1* | 3/2009 | Hareland ............... H01L 29/785 438/157 |
| 2012/0007051 A1* | 1/2012 | Bangsaruntip .... H01L 29/78645 977/762 |
| 2013/0089956 A1 | 4/2013 | Chang et al. |
| 2015/0053928 A1* | 2/2015 | Ching ................... H01L 27/092 257/29 |
| 2019/0043981 A1* | 2/2019 | Yoon ............... H01L 21/823821 |
| 2019/0237360 A1* | 8/2019 | Reznicek .......... H01L 29/66439 |
| 2020/0075875 A1* | 3/2020 | Vasen ................. H01L 51/0554 |
| 2020/0091448 A1* | 3/2020 | Li ....................... H01L 51/0048 |

FOREIGN PATENT DOCUMENTS

| | | |
|---|---|---|
| KR | 20190014898 A | 2/2019 |
| KR | 20200026653 A | 3/2020 |

* cited by examiner

FABRICATION METHOD OF A DOUBLE-GATE CARBON NANOTUBE TRANSISTOR

PRIORITY CLAIM AND CROSS-REFERENCE

This application claims the benefit of the following provisionally filed U.S. Patent application: Application No. 63/162,672, filed on Mar. 18, 2021, and entitled "Double Gate Carbon nanotube Transistor and Fabrication Method;" which application is hereby incorporated herein by reference.

BACKGROUND

Semiconductor industry has been following Moore's law to double the number of transistors per unit area every two years, which leads to higher computing performance with lower power and at lower cost in every new technology generation. The unwanted short channel effects (SCE), such as drain-induced barrier lowing (DIBL) and large subthreshold swing (SS) required for turning off the transistors, however, become increasingly more serious with the reduction of the size of transistors. It puts a severe limitation on transistor scaling. New innovations are needed to extend Moore's law.

Although the SCE could be mitigated by a corresponding reduction in the channel body thickness. The transistors using 3D bulk crystal channel materials (e.g. silicon, germanium, and III-V compound semiconductors) have degraded performance owing to pronounced carrier scattering near channel surface. In addition, as body thickness reduces, the variation in the threshold voltages also increases rapidly due to the increased sensitivity to body thickness variations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
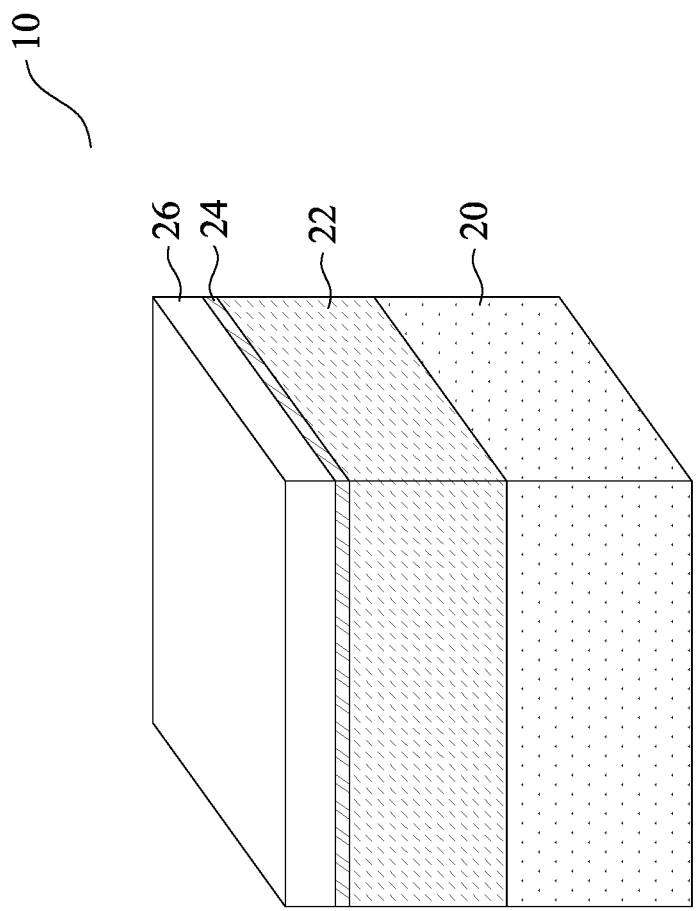
FIGS. 1-6, 7A, 8A, 9-11, and 12A illustrate the perspective views of intermediate stages in the formation of a double-gate carbon nanotube transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A double-gate Carbon Nanotube (CNT) transistor and the method of forming the same are provided. In accordance with some embodiments of the present disclosure, Carbon nanotubes are formed over a dielectric layer. A dummy gate is formed on the carbon nanotubes. The dummy gate is later removed, followed by the removal of a portion of the dielectric layer under the carbon nanotube transistors. The carbon nanotubes are thus suspended. A gate dielectric is formed to encircle (in a cross-sectional view) the carbon nanotubes. The gate dielectric includes a plurality of portions on the different carbon nanotubes, and the plurality of portions are joined together. A gate electrode is formed to encircle the gate dielectric. With the double-gate transistor, short-channel effect is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-6, 7A, 8A, 9-11, and 12A illustrate the cross-sectional views of intermediate stages in the formation of a double-gate carbon nanotube transistor in accordance with some embodiments of the present disclosure. The corresponding processes are also reflected schematically in the process flow shown in FIG. 17.

Referring to FIG. 1, wafer 10, which includes substrate 20, is provided. The substrate 20 may be a semiconductor substrate, such as a bulk semiconductor substrate, a Semiconductor-On-Insulator (SOI) substrate, or the like. Substrate 20 may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, SiC, GaAsP, AlInAs, AlGaAs, GaInAs, GaInP, and/or GaInAsP; or combinations thereof. Substrate 20 may also be formed of other materials such as sapphire, Indium tin oxide (ITO), or the like.

Figure 17:
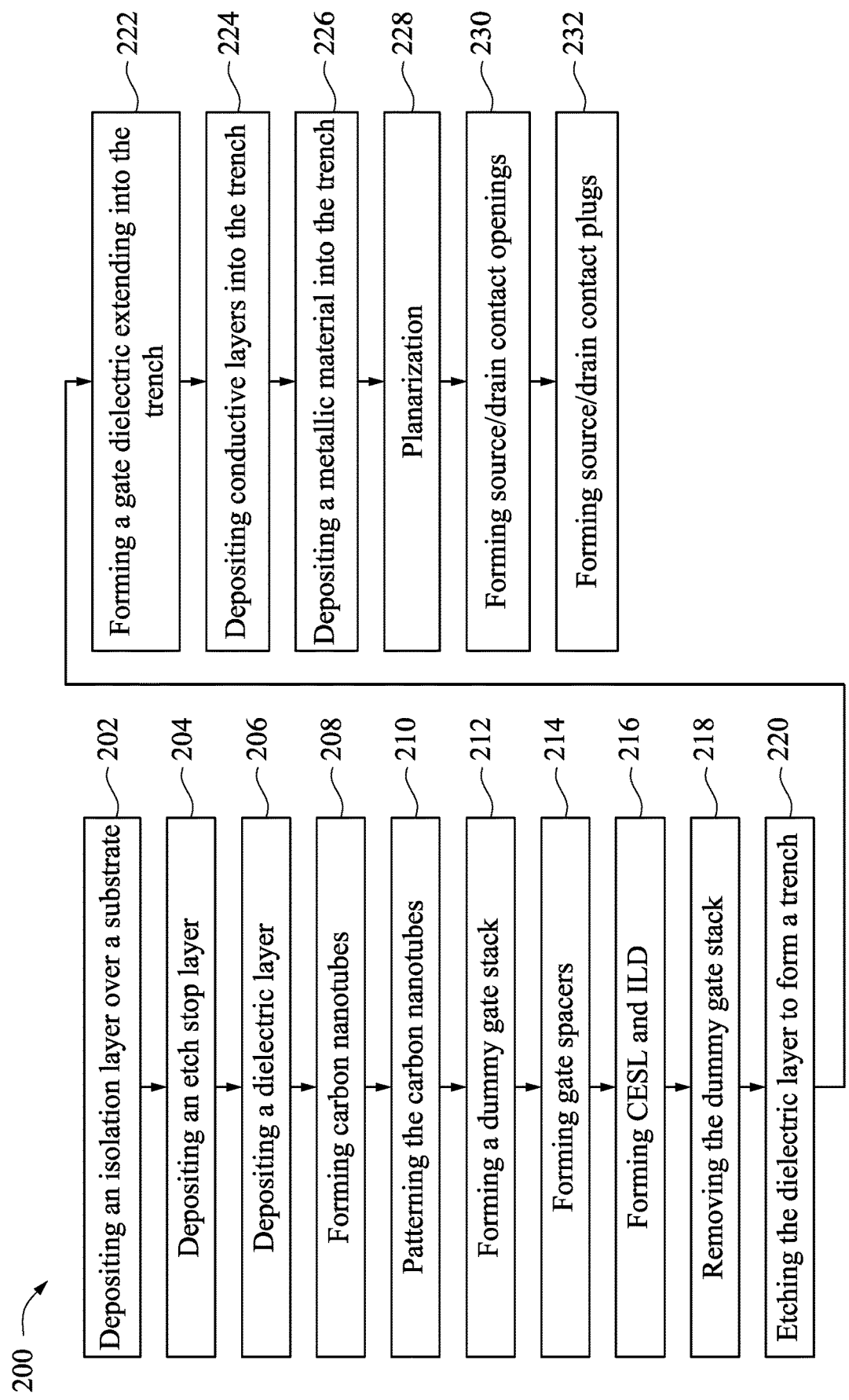
FIG. 17 illustrates a process flow for forming a double-gate carbon nanotube transistor in accordance with some embodiments.

Isolation layer 22 is deposited over substrate 20. The respective process is illustrated as process 202 in the process flow 200 as shown in FIG. 17. In accordance with some embodiments, isolation layer 22 is in physical contact with substrate 20. In accordance with alternative embodiments, between isolation layer 22 and substrate 20, there may be other layers and devices including, and not limited to, dielectric layers, metal features, or the like. For example, there may be an inter-layer dielectric, inter-metal dielectrics (which may include low-k dielectric layers), and/or the like. There may be, or may not be, integrated circuit devices such as passive devices (capacitors, resistors, inductors, or the like) and/or active devices (transistors, diodes, or the like) formed between isolation layer 22 and substrate 20.

In accordance with some embodiments of the present disclosure, isolation layer 22 is formed of or comprises an oxide such as silicon oxide, a nitride such as silicon nitride, a high-k dielectric material such as aluminum oxide, hafnium oxide, zirconium oxide, lanthanum oxide, or the like. The thickness of isolation layer 22 may be in the range between about 30 nm and about 50 nm. Isolation layer 22 may be formed through a deposition process, which may be performed through Chemical Vapor Deposition (CVD), Atomic Layer Deposition (ALD), Plasma enhanced Chemical Vapor Deposition (PECVD), Low Pressure Chemical Vapor Deposition (LPCVD), or the like.

Etch stop layer 24 is deposited over isolation layer 22. The respective process is illustrated as process 204 in the process flow 200 as shown in FIG. 17. The material of etch stop layer 24 is a dielectric material different from the material of isolation layer 22. In accordance with some embodiments, etch stop layer 24 is formed of or comprises aluminum oxide ($Al_2O_3$), oxygen-doped silicon carbide (SiOC), silicon nitride, or the like, combinations thereof, or multi-layers thereof. The thickness of etch stop layer 24 may be in the range between about 5 nm and about 10 nm. Etch stop layer 24 may be formed through a deposition process such as CVD, ALD, PECVD, LPCVD, or the like.

Dielectric layer 26 is then deposited over etch stop layer 24. The respective process is illustrated as process 206 in the process flow 200 as shown in FIG. 17. In accordance with some embodiments, dielectric layer 26 is formed of a dielectric material different from the material of etch stop layer 24, and may be the same or different from the material of isolation layer 22. In accordance with some embodiments of the present disclosure, dielectric layer 26 is formed of or comprises an oxide such as silicon oxide, a nitride such as silicon nitride, silicon oxynitride, or the like. Dielectric layer 26 may also be formed through a deposition process such as CVD, ALD, PECVD, LPCVD, or the like.

Nano structures 30 are then formed over dielectric layer 26. The respective process is illustrated as process 208 in the process flow 200 as shown in FIG. 17. In accordance with some embodiments, Nano structures 30 are carbon nanotubes 30, while they may also be formed other semiconductor materials. Throughout the description, nano structures 30 are referred to carbon nanotubes 30. Carbon nanotubes 30 are grown on dielectric layer 26, or grown on another wafer, and then transferred to dielectric layer 26. To form the carbon nanotubes 30, parallel catalyst strips (not shown) may be formed in accordance with some embodiments. The catalyst strips may be formed of a metal of iron, nickel, copper, molybdenum, tungsten, or the like, and may be formed of pure or substantially pure metal as aforementioned, for example, with the metal atomic percentage being higher than about 95 percent. The formation of the catalyst strips may include a lift-off process, or a deposition process followed by a patterning process. The deposition process may include a Physical Vapor Deposition (PVD) process, a Chemical Vapor Deposition (CVD) process, or the like.

The carbon nanotubes 30 may be grown using a carbon-containing precursor such as $CH_4$, $C_2H_6O$, $C_3H_8O$, combinations thereof, or the like, and may be formed, for example, through CVD. The temperature of wafer 10 may be in the range between about 600° C. and about 1,000° C., so that the precursor decomposes, and carbon is grown starting from the catalyst strips to form the carbon nanotubes 30. Carbon nanotubes 30 are grown from the catalyst strips and toward neighboring catalyst strips. The growth of the carbon nanotubes 30 is generally in the direction perpendicular to the sidewall of the catalyst strips, and parallel to the top surface of dielectric layer 26. In accordance with some embodiments of the present disclosure, the diameter of the carbon nanotubes 30 may be in the range between about 0.5 nm and about 2 nm.

In accordance with some embodiments, the catalyst strips are formed directly on dielectric layer 26, so that carbon nanotubes 30 are grown directly on dielectric layer 26. In accordance with alternative embodiments, the catalyst strips are formed on another wafer, and the resulting carbon nanotubes 30 are grown on another wafer. After the growth, carbon nanotubes 30 are transferred onto dielectric layer 26. Carbon nanotubes 30 can also be grown using solution-based methods, and then dispensed on wafer surface.

Figure 2:
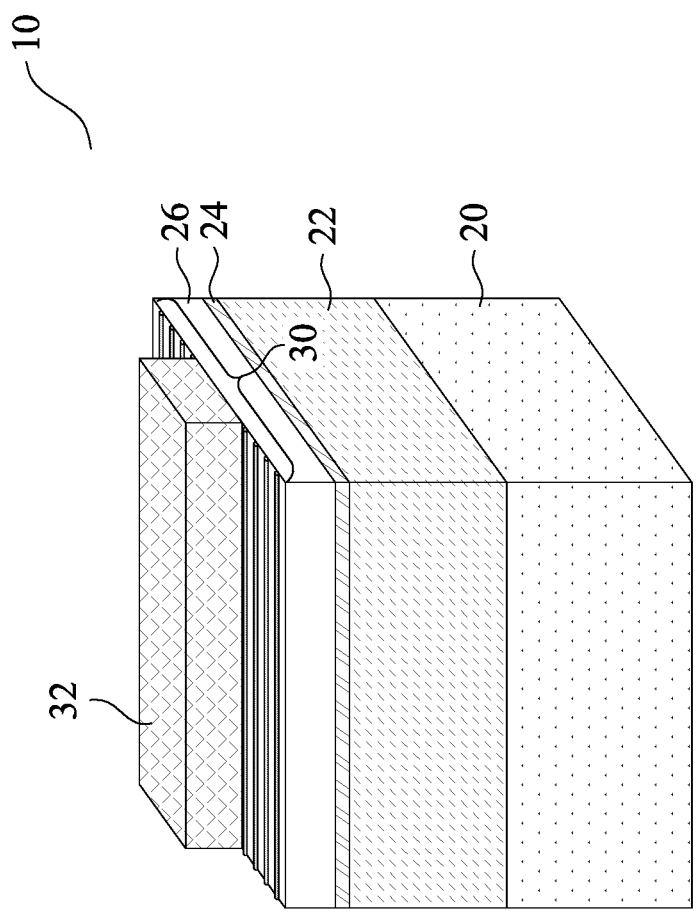

In accordance with some embodiments, the pitches between neighboring carbon nanotubes 30 are controlled to be in the range between about 2 nm and about 20 nm. It is appreciated that although FIG. 2 illustrates that carbon nanotubes 30 are parallel to each other, and have a uniform pitch, due to process variations, carbon nanotubes 30 may have non-parallel portions, and the pitches between neighboring carbon nanotubes 30 may vary, while the general trend of carbon nanotubes 30 are parallel. Also, although a single layer of carbon nanotubes 30 is illustrated, with each of the carbon nanotubes 30 being over and contacting dielectric layer 26, some portions of some carbon nanotubes 30 may be suspended slightly.

Figure 3:
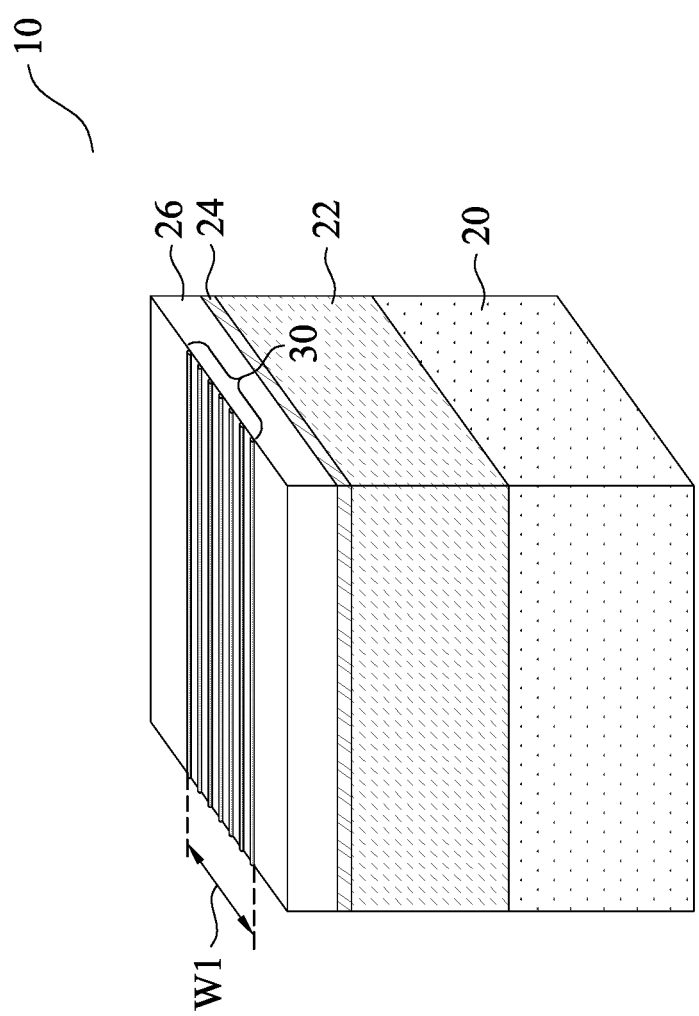

FIG. 2 also illustrates the formation and the patterning of etching mask 32. In accordance with some embodiments, etching mask 32 comprises a photo resist, which, after the patterning, covers portions of a plurality of carbon nanotubes 30. The edges of etching mask 32 are in directions parallel to (or perpendicular to) the lengthwise directions of carbon nanotubes 30. Next, etching mask 32 is used to etch carbon nanotubes 30, so that the exposed portions of carbon nanotubes 30 are removed, while the portions of carbon nanotubes 30 directly underlying etching mask 32 are preserved. The respective process is illustrated as process 210 in the process flow 200 as shown in FIG. 17. Etching mask 32 is then removed, and the resulting structure is shown in FIG. 3. Carbon nanotubes 30 collectively occupy an area. In accordance with some embodiments, the area has width W1, which may be in the range between about 15 nm and about 35 nm. Accordingly, in an example embodiment, there are about 5 to 15 carbon nanotubes left. It is appreciated that the desirable width W1 and the desirable number of carbon nanotubes are determined by the desirable current of the resulting transistor, and may be different from above-discussed.

Figure 4:
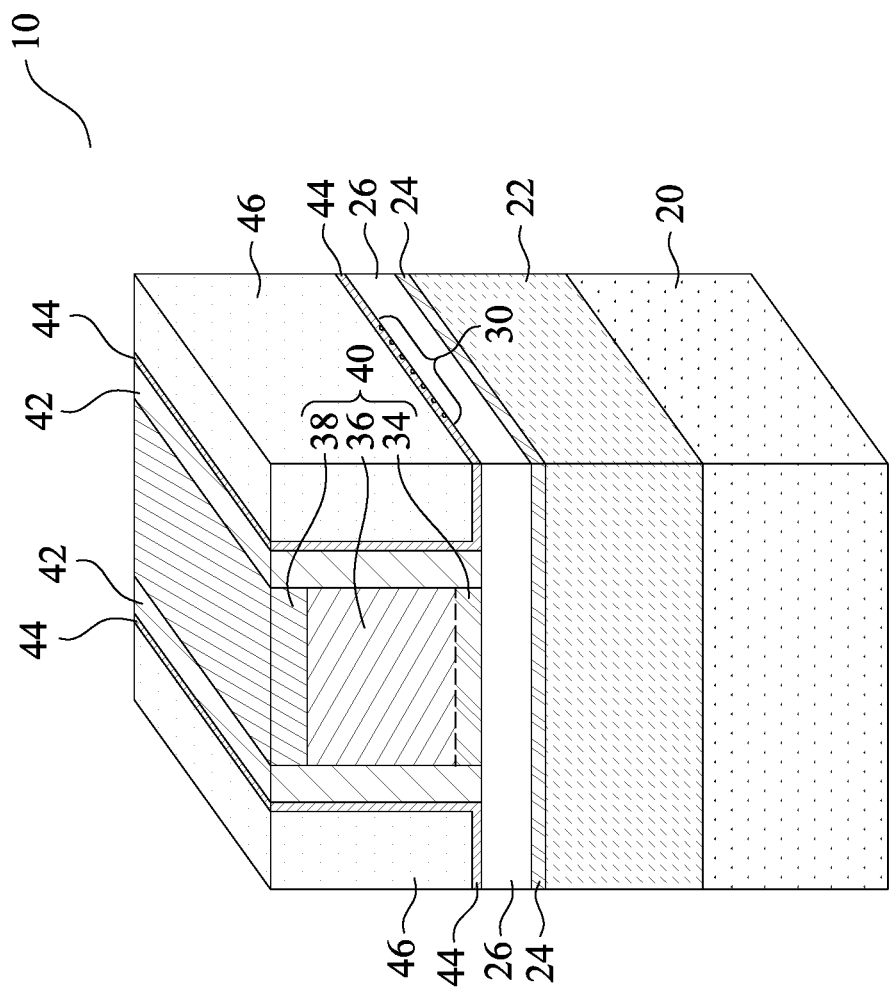

Referring to FIG. 4, dummy gate stack 40 is formed over dielectric layer 26 and carbon nanotubes 30. The respective process is illustrated as process 212 in the process flow 200 as shown in FIG. 17. The formation process of dummy gate stack 40 may include depositing a dummy gate dielectric layer (if formed), depositing a dummy gate electrode layer over dummy gate dielectric layer, depositing a hard mask layer(s) over the dummy gate electrode layer, and etching the deposited layers to form dummy gate stack(s) 40. Dummy gate stack 40 may include a dummy gate dielectric 34, and dummy gate electrode 36 over the respective dummy gate dielectric 34. Dummy gate dielectric 34 may comprise silicon oxide, silicon nitride, silicon carbo-nitride, silicon carbide, or the like, and covers and is in contact with carbon nanotubes 30. In accordance with alternative embodiments, the formation of gate dielectric is skipped, and the subsequently formed dummy gate electrode 36 is formed directly on carbon nanotubes 30. In accordance with some embodiments, gate dielectric 34, when formed, may be formed of a material different from the material of dielectric layer 26, so that in the subsequent etching process, the etching of the gate dielectric 34 is stopped on dielectric layer 26. In accordance with alternative embodiments, gate dielectric 34, when formed, may be formed of a material same as the material of dielectric layer 26, so that in the subsequent etching process, gate dielectric 34 and dielectric layer 26 are etched in a same etching process. Dummy gate electrode 36 may be formed, for example, using polysilicon, and other materials such as amorphous carbon may also be used. Dummy gate stack 40 may also include one (or a plurality of) hard mask layer 38 over dummy gate electrode 36. Hard mask layer 38 may be formed of silicon nitride, silicon oxide, silicon oxy-nitride, or multi-layers thereof.

Dummy gate stack 40 crosses over the plurality of carbon nanotubes 30, and has a lengthwise direction in a direction perpendicular to the lengthwise direction of carbon nanotubes 30. It is appreciated that although one dummy gate stack 40 is show, there may be a plurality of parallel dummy gate stacks formed, which are parallel to each other, and cross over the same group of carbon nanotubes 30.

Next, gate spacers 42 are formed on the sidewalls of dummy gate stack 40. The respective process is illustrated as process 214 in the process flow 200 as shown in FIG. 17. In accordance with some embodiments of the present disclosure, gate spacers 42 are formed of a dielectric material(s) such as silicon nitride (such as $Si_3N_4$), silicon oxynitride, silicon oxy-carbo-nitride, silicon carbo-nitride, or the like, and may have a single-layer structure or a multi-layer structure including a plurality of dielectric layers. The formation of gate spacers 42 may include depositing one or a plurality of spacer layers, and performing an anisotropic etching process(es) on the spacer layer to remove horizontal portions of the spacer layer(s), while vertical portions of the spacer layer(s) are left as being gate spacers 42.

FIG. 4 also illustrates the formation of Contact Etch Stop Layer (CESL) 44 and Inter-Layer Dielectric (ILD) 46. The respective process is illustrated as process 216 in the process flow 200 as shown in FIG. 17. CESL 44 may be formed of silicon oxide, silicon nitride, silicon carbo-nitride, or the like, and may be formed using CVD, ALD, or the like. ILD 46 may include a dielectric material formed using, for example, FCVD, spin-on coating, CVD, or another deposition process. ILD 46 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 46, dummy gate stack 40, and gate spacers 42 with each other.

Figure 5:
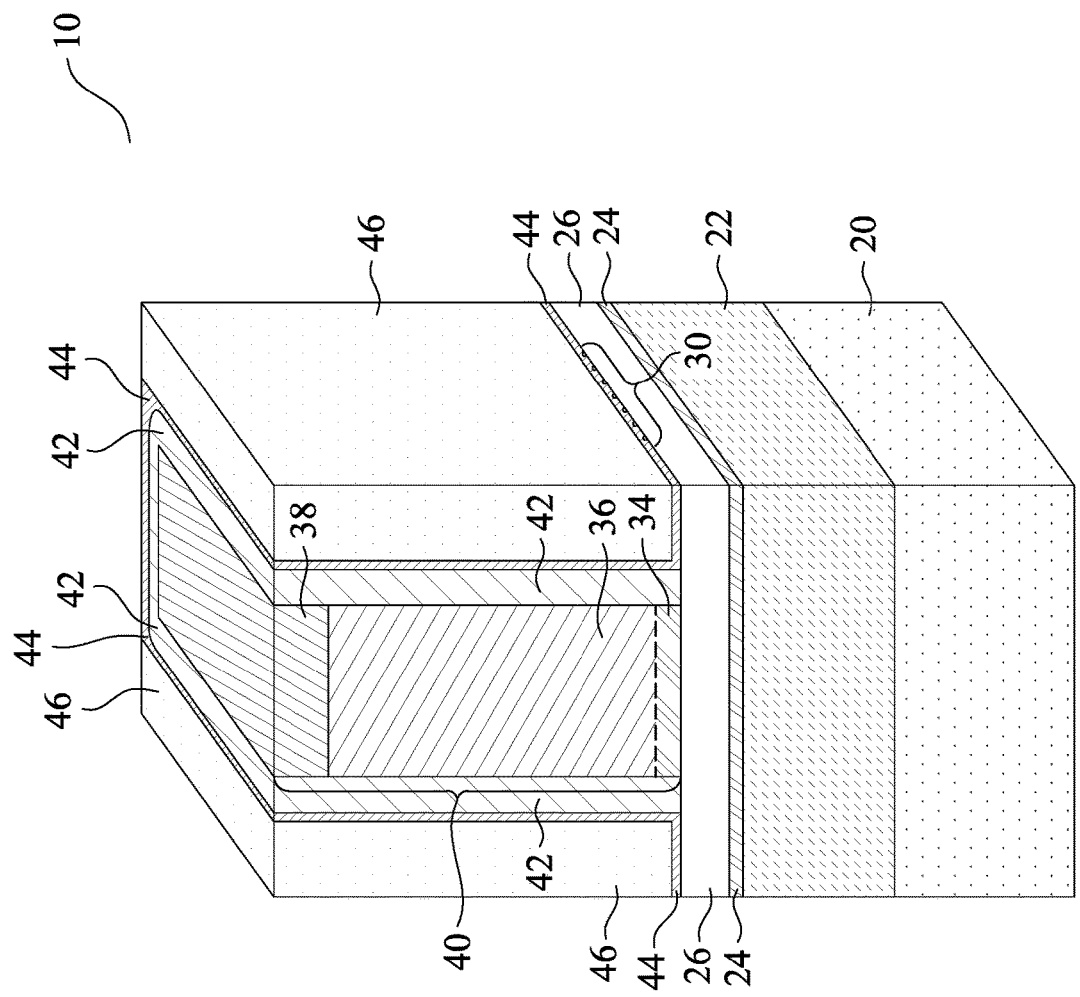
Figure 8A:
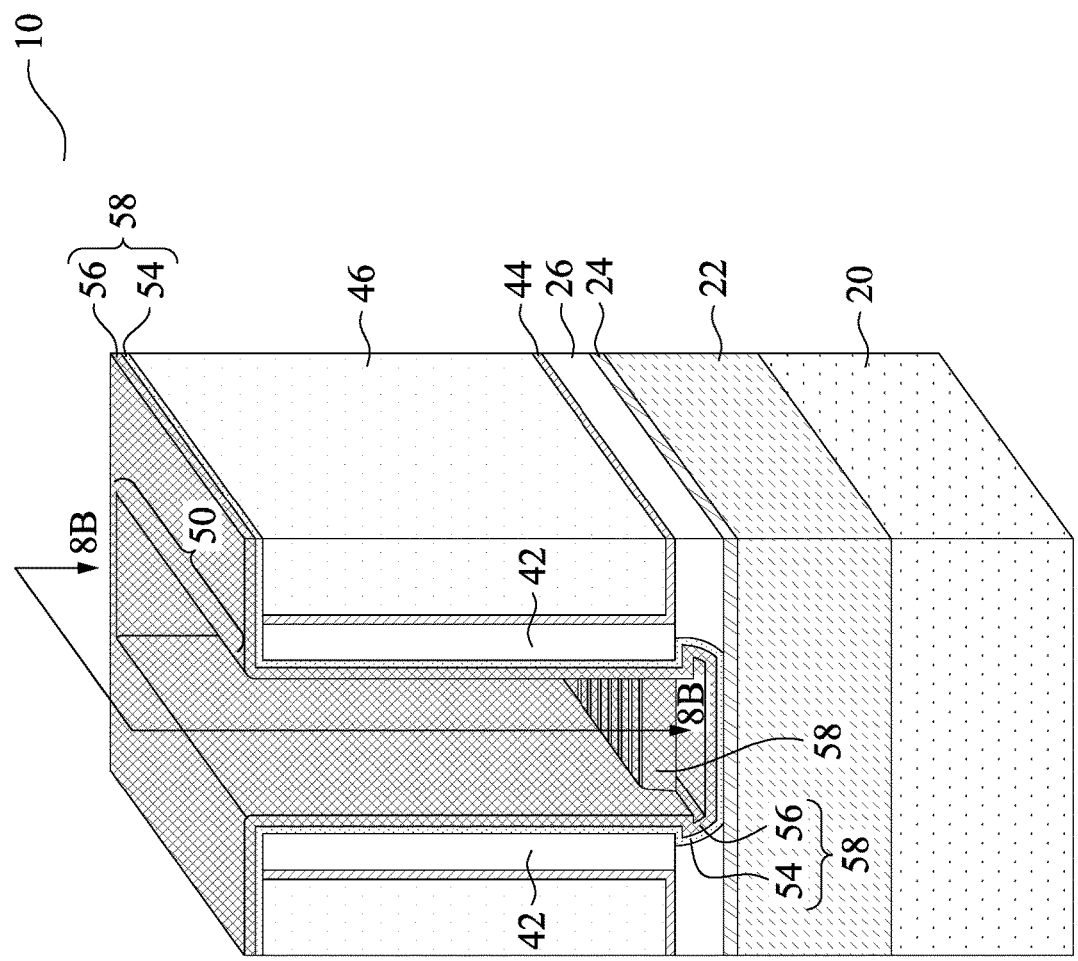
Figure 9:
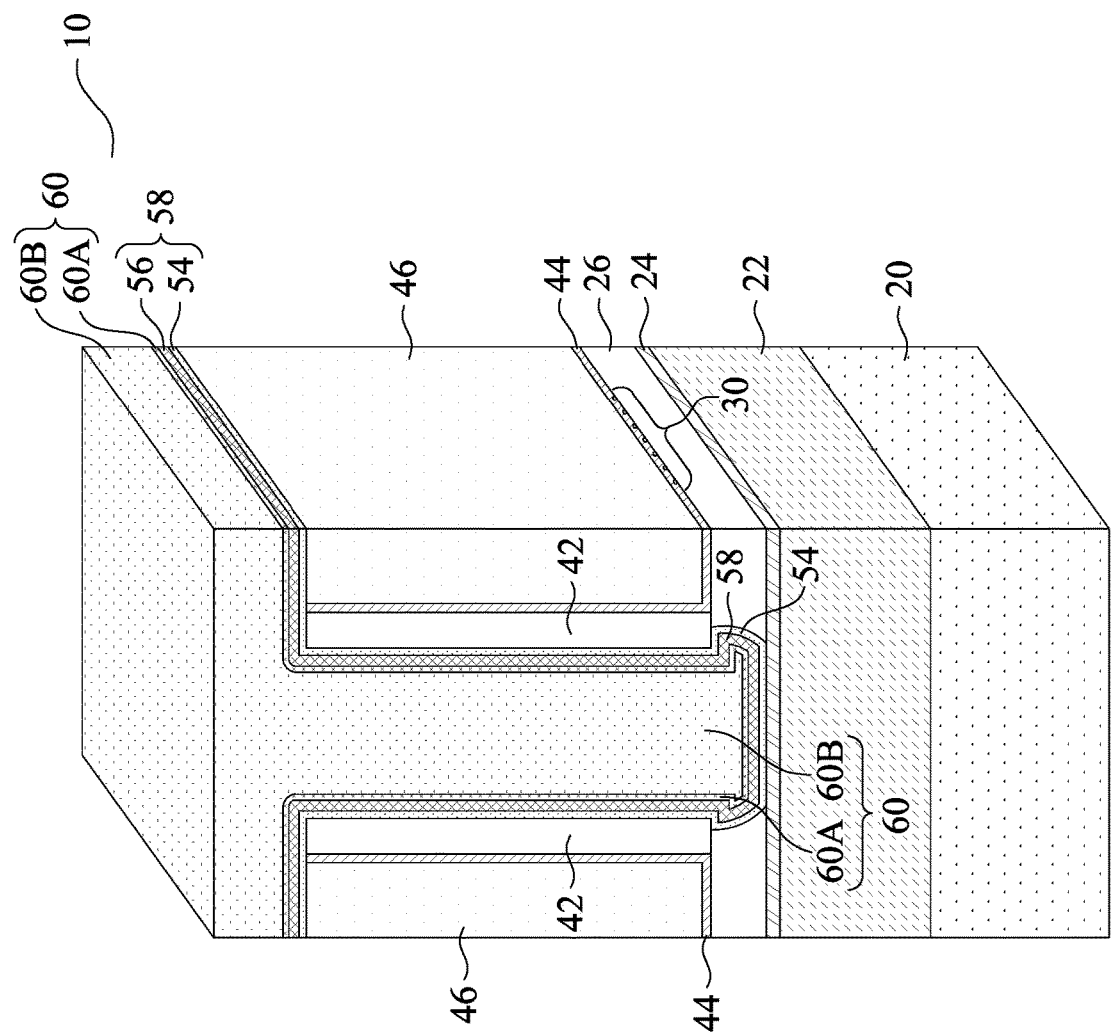
Figure 10:
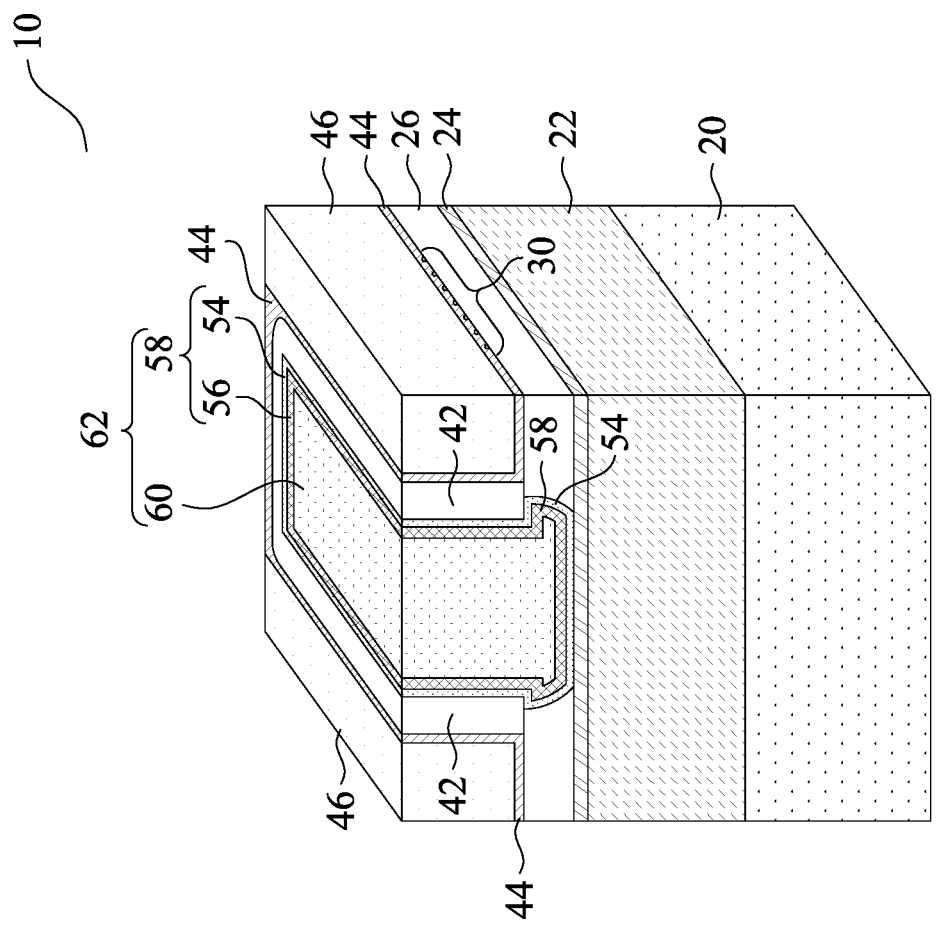

FIGS. 5, 6, 7A, 8A, and 9-10 illustrate the removal of dummy gate stack 40 and the formation of replacement gate stack 62 (FIG. 10). FIG. 5 illustrates the same structure as in FIG. 4, except FIG. 5 shows the view from a different angle than in FIG. 4. Also, an end of dummy gate stack 40 and the respective portion of gate spacer 42 is illustrated.

Figure 6:
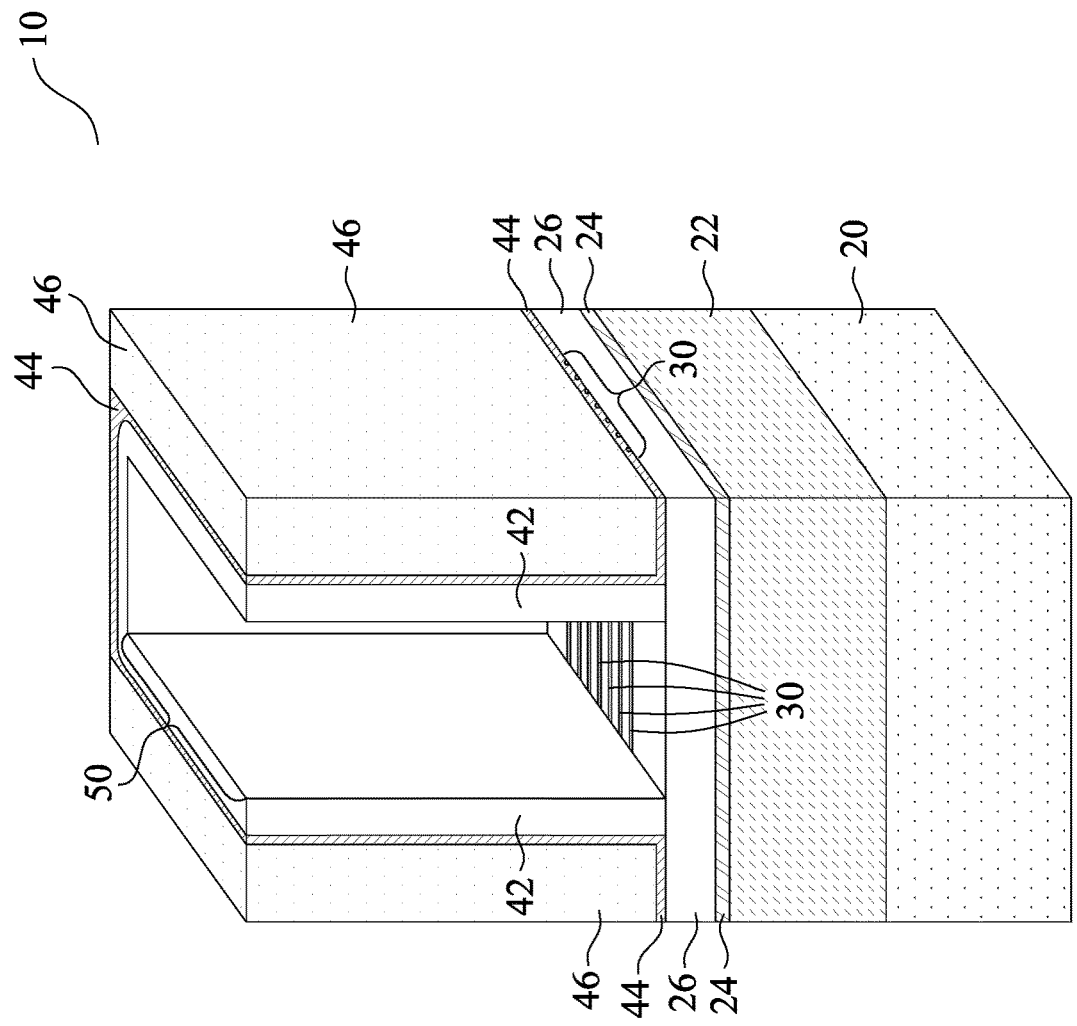

Dummy gate stack 40, which include hard mask layer 38, dummy gate electrode 36, and dummy gate dielectric 34, is then removed. The resulting structure is shown in FIG. 6. The respective process is illustrated as process 218 in the process flow 200 as shown in FIG. 17. Trench 50 is thus formed. The removal process may be performed through one or a plurality of etching processes, depending on the materials of mask layers 38, dummy gate electrode 36, and dummy gate dielectric 34. The etching may include wet and/or dry etching processes. As a result of the removal of dummy gate stack 40, carbon nanotubes 30 are revealed. In accordance with some embodiments, the etching stops on the top surface of dielectric layer 26. It is appreciated that carbon nanotubes 30 may include some portions exposed to trench 50, and some other portions underlying gate spacers 42, CESL 44, and ILD 46. The ends of carbon nanotubes 30 are illustrated in FIG. 6.

Figure 7A:
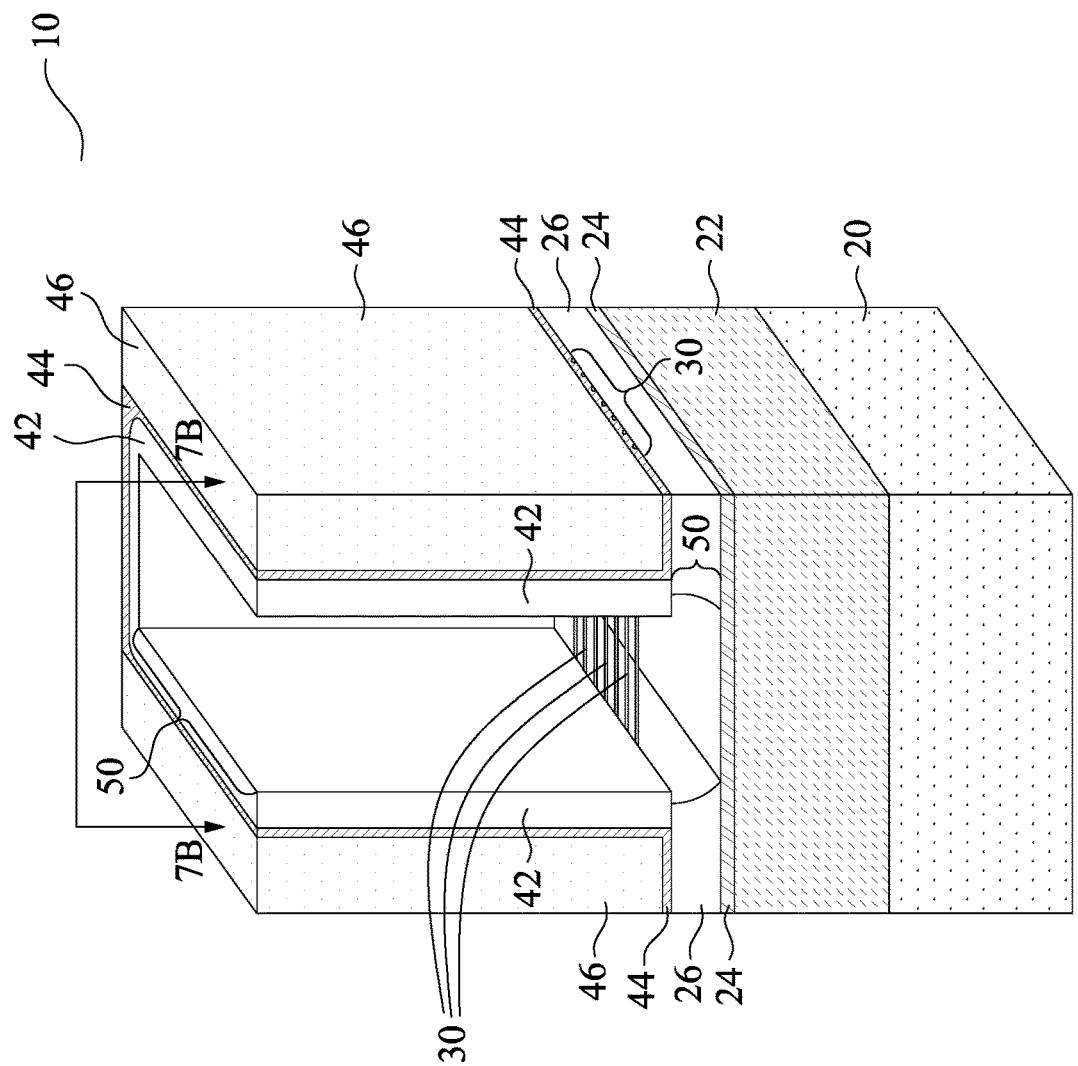

Next, referring to FIG. 7A, an etch process is performed to etch dielectric layer 26. The respective process is illustrated as process 220 in the process flow 200 as shown in FIG. 17. Dielectric layer 26 is etched-through, and the etching process is stopped on etch stop layer 24. The etching may be performed using an isotropic etching process, which may be a wet etching process or a dry etching process. With the isotropic etching process being adopted, the portions of dielectric layer 26 directly underlying carbon nanotubes 30 are also etched. The etching may also be an anisotropic with slight isotropic etching effect. As a result of the etching of dielectric layer 26, carbon nanotubes 30 are suspended, with the portions of carbon nanotubes underlying gate spacers 42 and CESL 44 acting as the support of the suspended portions. The suspended portions of carbon nanotubes 30 are separated from each other by air gaps. In accordance with some embodiments in which dielectric layer 26 is formed of or comprises silicon oxide, the etching gas may include $CF_4$, $SF_6$, or the like may be used when dry etching is performed. When wet etching is adopted, the etching chemical may include HF, $NH_4F$, or the like.

Figure 7D:
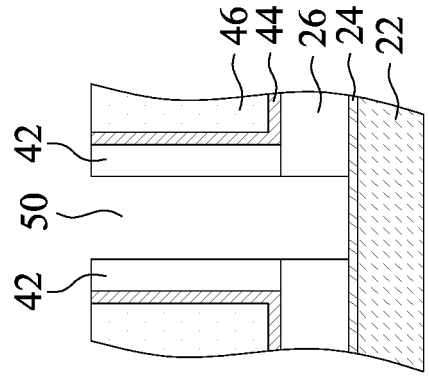
FIGS. 7B-7F illustrate the profiles of trenches formed by removing a dummy gate stack in accordance with some embodiments.
Figure 7C:
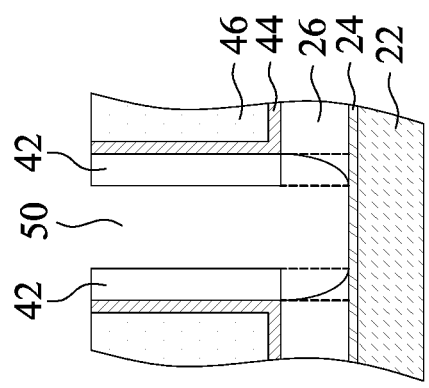
Figure 7B:
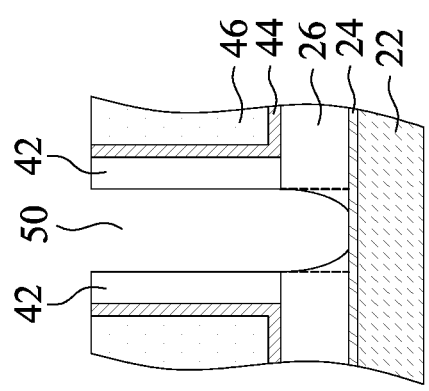

FIGS. 7B through 7F illustrate the reference cross-sectional 7B-7B in FIG. 7A in accordance with some embodiments. The dashed lines in these figures are the lines drawn extending from the inner edges of gate spacers 42 downwardly. FIG. 7B illustrates the profile of trench 50 in accordance with some embodiments of the present disclosure. The profile is a result of the anisotropic etching process for etching dielectric layer 26. Due to the shading effect and pattern loading effect, when plasma is generated in the anisotropic etching process, the portions of dielectric layer 26 close to the middle between opposing gate dielectrics 14 are etched faster than the portions closer to the gate spacers 42, hence forming the curved sidewalls. Trench 50 does not extend directly underlying gate spacers 42 in accordance with some embodiments. As a result of the profile as shown in FIG. 7B, the subsequently formed replacement gate stack 62 (FIG. 10) has a bottom portion extending lower than the bottom surfaces of gate spacers 42, and is limited in the region between opposing gate spacers 42. The bottom surface of the resulting replacement gate stack 62 (FIG. 10) will also have a planar portion connecting to the curved (rounded) sidewalls.

FIG. 7C illustrates the profile of trench 50 in accordance with alternative embodiments of the present disclosure. The profile may be a result of an isotropic etching process in accordance with some embodiments, wherein dielectric layer 26 is etched both vertically and horizontally. The profile may also be formed through an anisotropic etching process followed by an extended over-etching process, wherein the bottom portion of trench 50 expends laterally due to the over-etching process. The bottom portion of trench 50 in dielectric layer 26 extends directly underlying gate spacers 42, and the edges of the bottom portion of trench 50 may be aligned to the outer edges of gate spacers 42. As a result of the profile as shown in FIG. 7C, the subsequently formed replacement gate stack 62 (FIG. 10) has a bottom portion extending lower than the bottom surfaces of gate spacers 42, and the bottom portion includes portions directly underlying opposing gate spacers 42. The outer edges of trench 50 may also be vertically aligned to the outer edges of gate spacers 42. The bottom surface of the resulting replacement gate stack 62 (FIG. 10) will also have a planar portion connecting to the curved (rounded) sidewalls.

FIG. 7D illustrates the profile of trench 50 in accordance with alternative embodiments of the present disclosure. The profile is a result of an anisotropic etching process. As a result of the anisotropic etching process, the edges of dielectric layer 26 facing the bottom portion of trench 50 are straight and vertical, and are aligned to the inner edges of gate spacers 42. As a result of the profile as shown in FIG. 7D, the bottom portion of the subsequently formed replacement gate stack 62 (FIG. 10) has vertical edges in dielectric layer 26. The bottom portion of replacement gate stack 62 is also limited in the region between gate spacers 42, and does not extend directly underlying gate spacers 42.

Figure 7F:
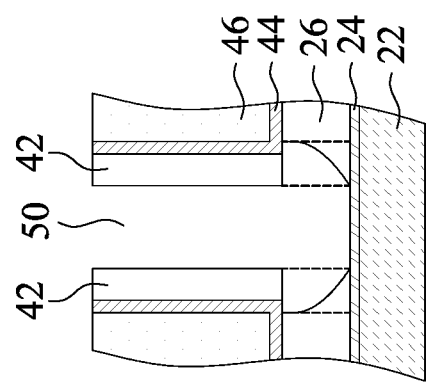
Figure 7E:
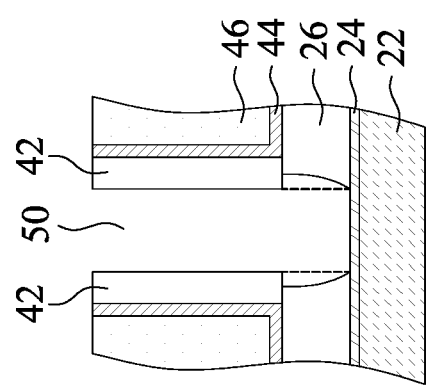

FIG. 7E illustrates the profile of trench 50 in accordance with alternative embodiments of the present disclosure. The profile may be a result of an isotropic etching process in accordance with some embodiments, wherein dielectric layer 26 is etched both vertically and horizontally. The profile may also be formed by an anisotropic etching process followed by an extended over-etching process, wherein the bottom portion of trench 50 expends laterally due to the over-etching process. The bottom portion of trench 50 in dielectric layer 26 extends directly underlying gate spacers 42, and the edges of the bottom portion of trench 50 may fall between the inner edges and the outer edges of gate spacers 42. As a result of the profile as shown in FIG. 7E, the subsequently formed replacement gate stack 62 (FIG. 10) has a bottom portion extending lower than the bottom surfaces of gate spacers 42, and the bottom portion includes portions directly underlying opposing gate spacers 42. The bottom surface of the replacement gate stack 62 will also have a planar portion connecting to the curved (rounded) sidewalls.

FIG. 7F illustrates the profile of trench 50 in accordance with alternative embodiments of the present disclosure. The profile may be a result of an isotropic etching process in accordance with some embodiments, wherein dielectric layer 26 is etched both vertically and horizontally. The bottom portion of trench 50 in dielectric layer 26 extends laterally beyond the outer edges of gate spacers 42, and is vertically aligned to CESL 44 or even ILD 46. As a result of the profile as shown in FIG. 7F, the subsequently formed replacement gate stack 62 (FIG. 10) has a bottom portion extending lower than the bottom surface of gate spacers 42, and the bottom portion includes portions directly underlying opposing gate spacers 42. The resulting replacement gate stack 62 (FIG. 10) may extend beyond the outer edges of gate spacers 42, and may extend directly underlying CESL 44 and ILD 46. The bottom surface of the replacement gate stack 62 will also have a planar portion connecting to the curved (rounded) sidewalls.

FIG. 8A illustrates a perspective view in the formation of gate dielectric 58, which includes interfacial layer 54. The respective process is illustrated as process 222 in the process flow 200 as shown in FIG. 17. In accordance with some embodiments, interfacial layer 54 is formed of or comprises silicon oxide, aluminum oxide, or the like. Interfacial layer 54 may have a thickness in the range between about 0.5 nm and about 1.5 nm. The deposition process may include ALD, CVD, nanofog, or the like, so that interfacial layer 54 is conformal, and may extend on the exposed surfaces including the top surfaces, sidewalls, and the exposed bottom surfaces of carbon nanotubes 30 and gate spacers 42. Interfacial layer 54 also extends on the top surfaces of CESL 44 and ILD 46.

In accordance with some embodiments, gate dielectric 58 also includes high-k dielectric layer 56 on interfacial layer 54. In accordance with some embodiments, high-k dielectric layer 56 is formed of or comprises aluminum oxide ($Al_2O_3$), hafnium oxide, zirconium oxide, lanthanum oxide, aluminum oxide, silicon nitride, or the like, or composite layers thereof. Some dielectric materials can induce either electrons or holes in the carbon nanotubes 30, and can further improve n-type or p-type conductivity. For example, carbon nanotubes tend to be p-type when formed without doping, and a hafnium-containing film can donate electrons to the carbon nanotubes, and benefit the n-type conduction. Accordingly, hafnium film may be used for the formation of the interfacial layer of n-type transistors, while aluminum oxide may be used for the formation of the interfacial layer of the p-type transistors. High-k dielectric layer 56 may have a thickness in the range between about 1 nm and about 5 nm. The deposition process may include ALD, CVD, or the like, so that high-k dielectric layer 56 is conformal.

Figure 8B:
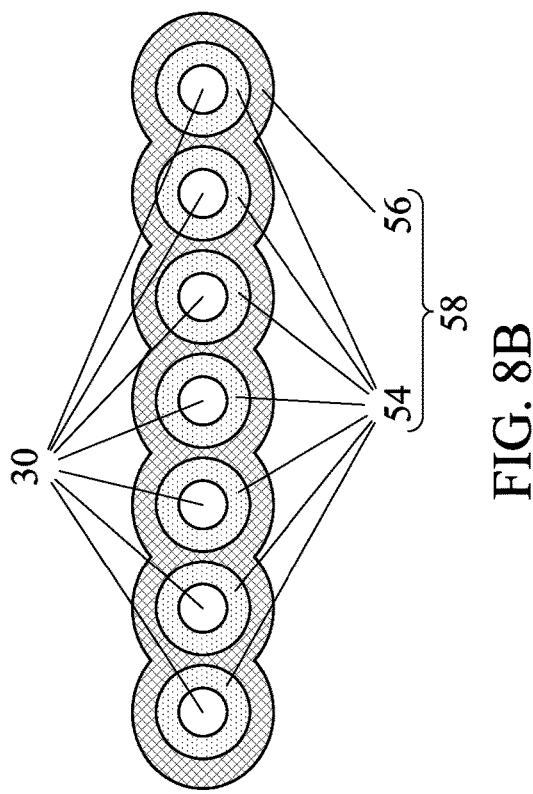
FIGS. 8B and 8C illustrate the cross-sectional views of a carbon nanotube and gate dielectrics surrounding the carbon nanotube in accordance with some embodiments.
Figure 8C:
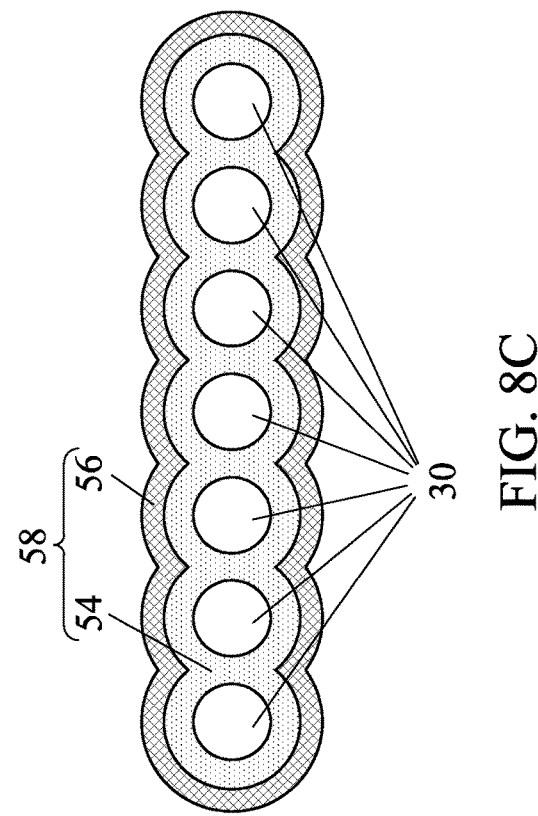

FIGS. 8B and 8C illustrate the reference cross-section 8B-8B in FIG. 8A. Referring to FIG. 8B, each of the carbon nanotubes 30 is encircled by an interfacial layer 54, and the interfacial layers 54 on different carbon nanotubes 30 are spaced apart from each other by high-k dielectric layer 56.

High-k dielectric layer 56 encircles each of the carbon nanotubes 30 and the corresponding portions of the discrete interfacial layers 54.

In FIG. 8C, each of the carbon nanotubes 30 is encircled by an interfacial layer 54, and the interfacial layers 54 on different carbon nanotubes 30 are joined with each other to form a continuous interfacial layer. High-k dielectric layer 56 encircles the combined region including carbon nanotubes 30 and interfacial layer 54. High-k dielectric layer 56 does not separate interfacial layers 54 on different carbon nanotubes 30 from each other.

Referring to FIG. 9, a plurality of stacked conductive layers 60A are formed to extend into trench 50 (FIG. 8A). The respective process is illustrated as process 224 in the process flow 200 as shown in FIG. 17. In accordance with some embodiments, the layers in the stacked conductive layers 60A are not shown separately, while the stacked conductive layers 60A may be distinguishable from each other. The deposition of the stacked conductive layers 60A may be performed using a conformal deposition method(s) such as ALD or CVD. The stacked conductive layers 60A may include a diffusion barrier layer (also sometimes referred to as a glue layer) and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The material of the work-function layer is selected according to whether the respective transistor is an n-type transistor or a p-type transistor. For example, when the transistor is an n-type transistor, the work-function layer may include a low work-function metal, which may have a work function in the range between about 3 eV and about 4 eV. The low work-function metal may include Sc, Y, Er, La, Hf, Al, Ti, or the like, or alloys thereof. When the transistor is a p-type transistor, the work-function layer may include a high work-function metal, which may have a work function in the range between about 5 eV and about 6 eV. The high work-function metal may include Pt, Pd, Ni, Au, or the like, or alloys thereof. After the deposition of the work-function layer(s), a capping layer, which may be another TiN layer, may be formed. The capping layer may or may not fully fill trench 50.

The deposited conductive layers 60A are formed as conformal layers extending into the trenches, and include some portions over ILD 46. Next, if the deposited conductive layers 60A have not fully filled trench 50, a filling metallic material 60B is deposited to fill the remaining trenches. The respective process is illustrated as process 226 in the process flow 200 as shown in FIG. 17. The metallic material 60B may be formed of tungsten or cobalt, for example.

Referring to FIG. 10, a planarization process such as a CMP process or a mechanical grinding process is performed. The respective process is illustrated as process 228 in the process flow 200 as shown in FIG. 17. The portions of the gate dielectric layers, stacked conductive layers, and the metallic material over ILD 46 are removed. As a result, gate electrode 60 and gate dielectric 58 are formed. Gate electrode 60 and gate dielectric 58 are collectively referred to as replacement gate stack 62. The top surfaces of replacement gate stack 62, gate spacers 42, CESL 44, and ILD 46 may be substantially coplanar at this time. As discussed referring to FIGS. 7B through 7F, the bottom portion of replacement gate stack 62 inside dielectric layer 26 may have different profiles and different widths (relative to the distance between gate spacers 42), which are determined by the profile of openings 50 as shown in FIGS. 7B through 7F.

Figure 11:
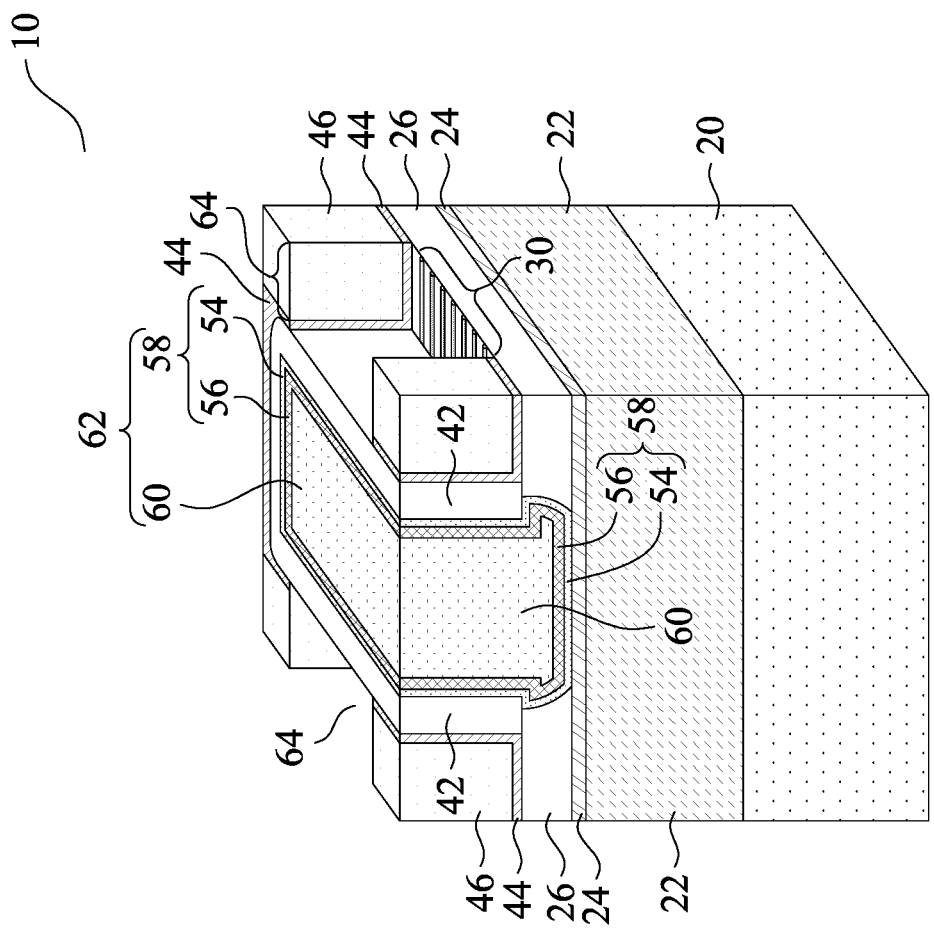

Referring to FIG. 11, an etching process is performed to etch CESL 44 and ILD 46, so that source/drain contact openings 64 are formed. The respective process is illustrated as process 230 in the process flow 200 as shown in FIG. 17. Carbon nanotubes 30 are thus exposed. The etching is stopped on the top surface of dielectric layer 26. In accordance with some embodiments, as shown in FIG. 11, the sidewalls of gate spacers 42 are exposed. In accordance with alternative embodiments, source/drain contact openings 64 are spaced apart from the nearest gate spacers 42 by some un-etched portions of CESL 44 and ILD 46.

Figure 12A:
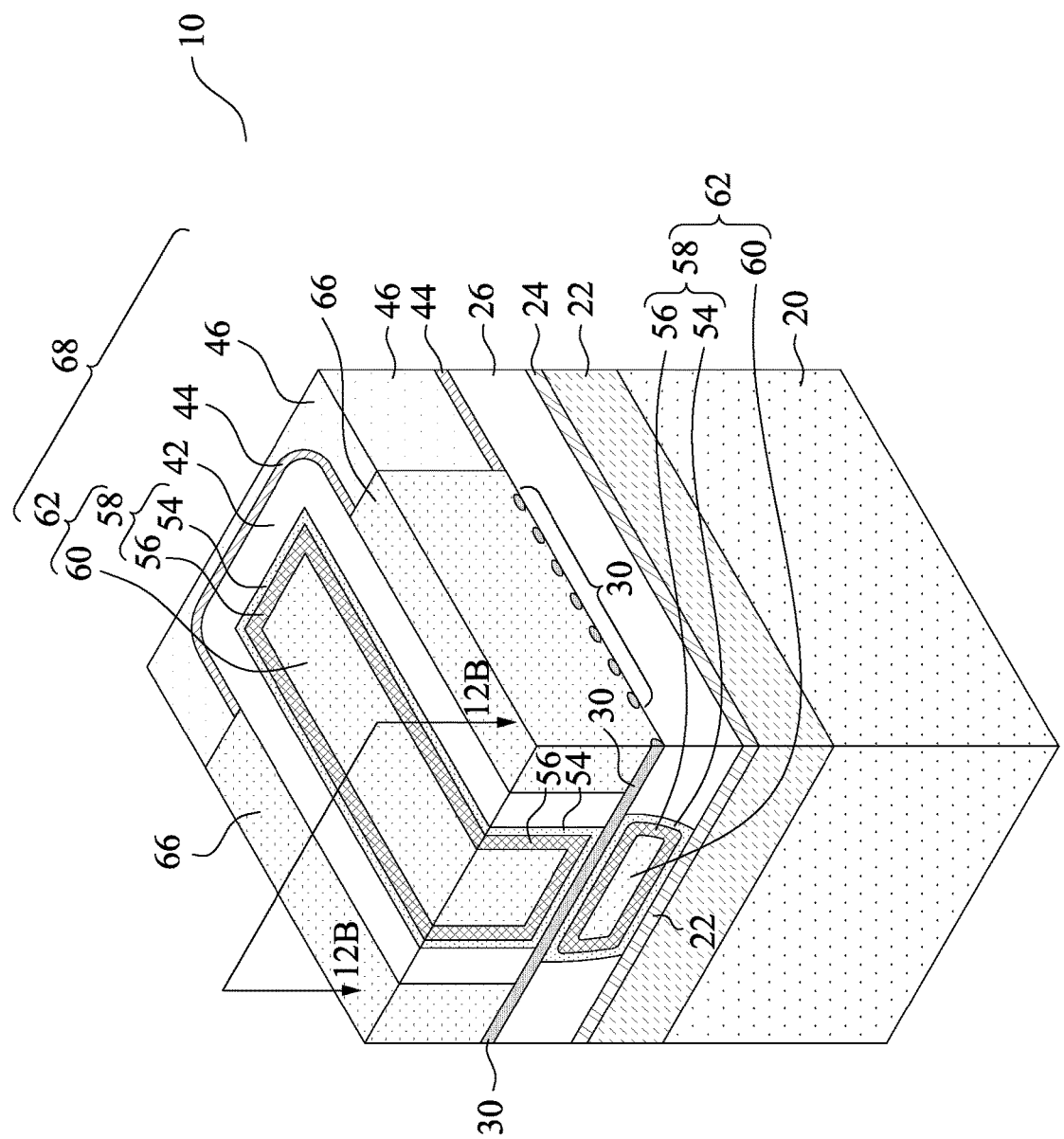

Next, Referring to FIG. 12A, source/drain contact plugs 66 are formed in source/drain contact openings 64. The respective process is illustrated as process 232 in the process flow 200 as shown in FIG. 17. In accordance with some embodiments, source/drain contact plugs 66 are formed of or comprise a conductive material selected from tungsten, cobalt, palladium (Pd), silver (Ag), nickel(Ni), gold (Au), titanium (Ti), gadolinium (Gd), or alloys thereof. The formation process may include filling a conductive material into source/drain contact openings 64, and then performing a planarization process such as a CMP process or a mechanical grinding process to remove excess portions of the conductive material over ILD 46. Source/drain contact plugs 66 may or may not include a barrier layer, which, if formed, may comprise titanium, titanium nitride, tantalum, tantalum nitride, or the like. Double-gate carbon nanotube transistor 68 is thus formed.

In above-discussed processes, source/drain contact plugs 66 are formed after the formation of replacement gate stack 62. In accordance with alternative embodiments, source/drain contact plugs 66 are formed before the formation of replacement gate stack 62, and the processes shown in FIGS. 11 and 12A are performed before the processes as shown in FIGS. 6, 7A, 8A, and 9-10.

Figure 12B:
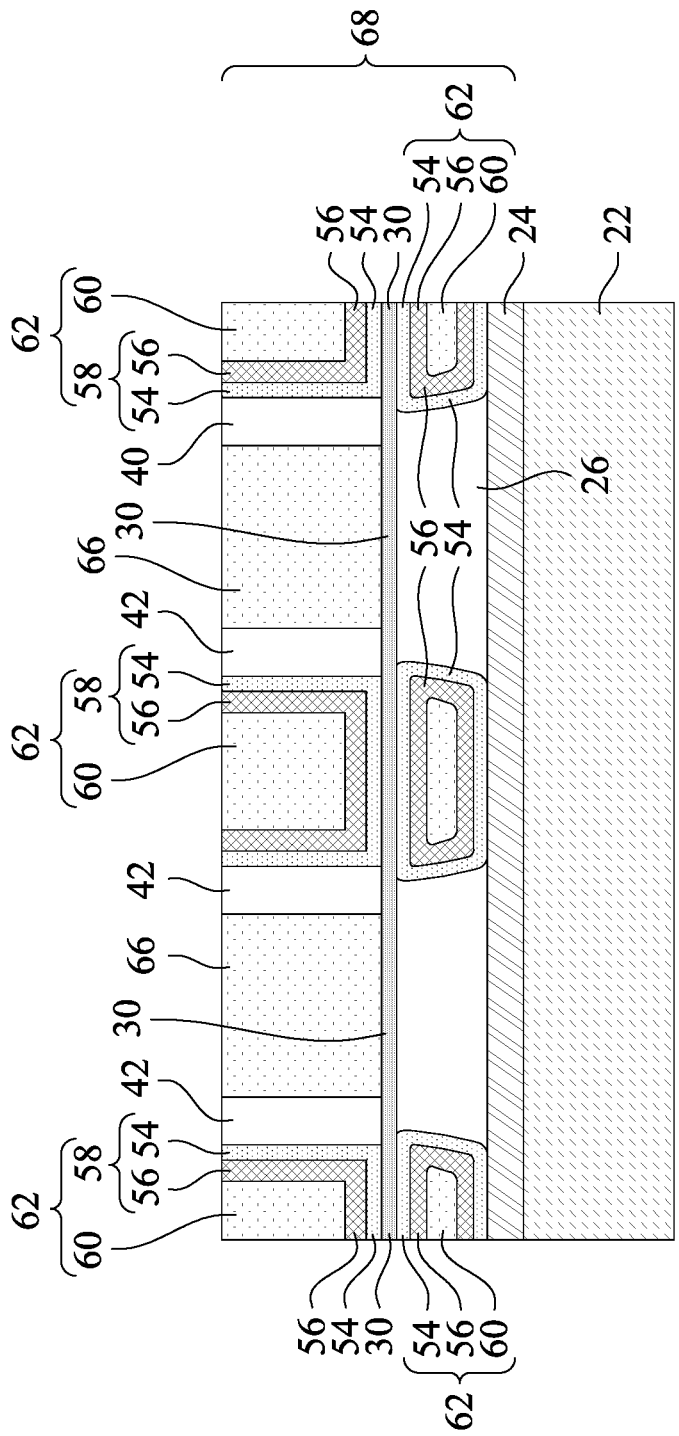
FIG. 12B illustrates a cross-sectional view of a gate of two double-gate carbon nanotube transistors in accordance with some embodiments.

FIG. 12A also shows a cross-section cutting through one of carbon nanotubes 30. As shown in FIG. 12A, gate electrode 60 includes an upper portion overlapping carbon nanotubes 30, and a lower portion overlapped by carbon nanotubes 30. Gate dielectric 58, in addition to the portions surrounding carbon nanotube 30, also has first portions deposited on the sidewalls of dielectric layer 26 and gate spacers 42, and a second portion on a top surface of etch stop layer 24. FIG. 12B illustrates the reference cross-section 12B-12B in FIG. 12A.

Figure 13:
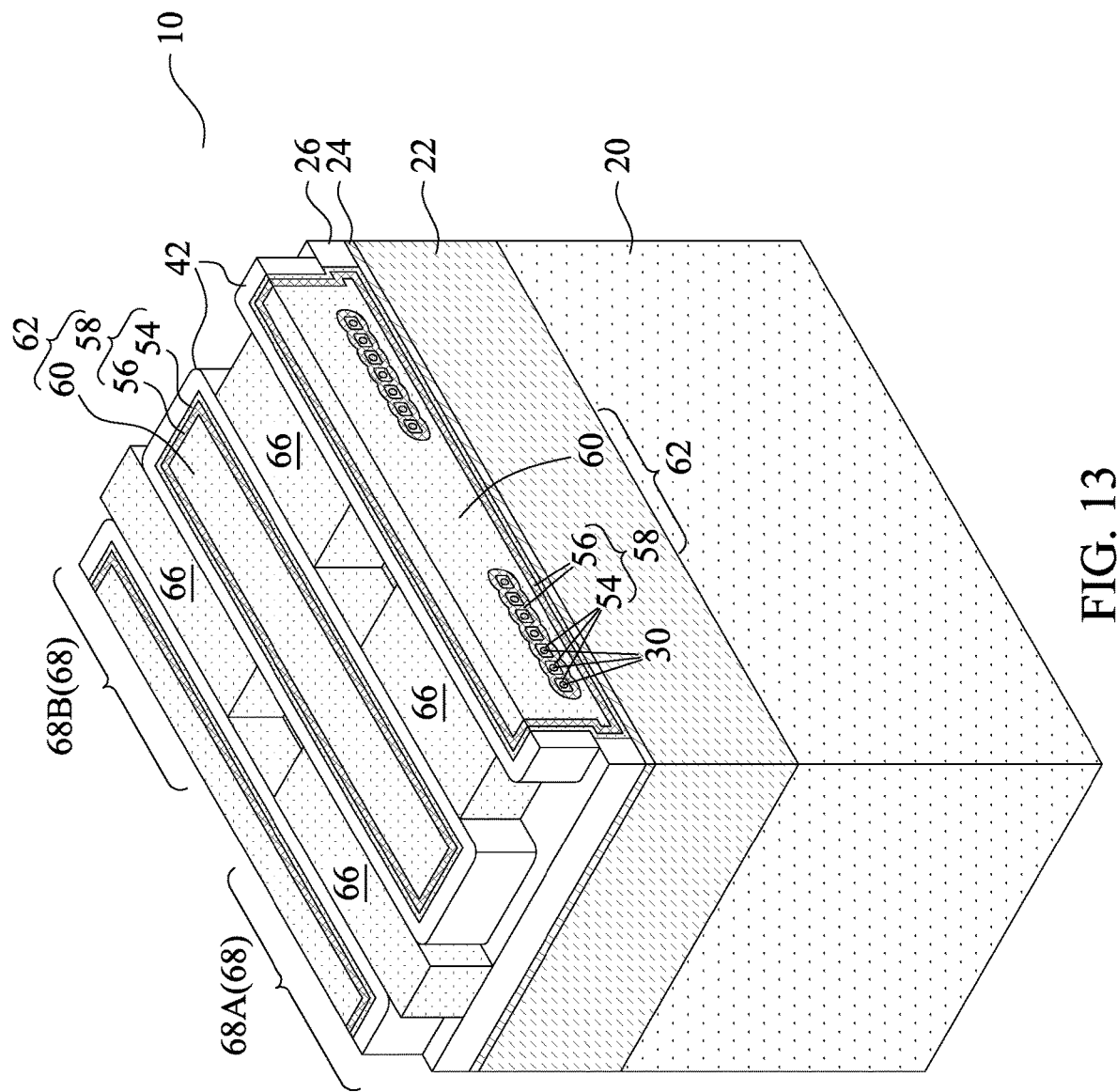
FIG. 13 illustrates a perspective view of a double-gate carbon nanotube transistor in accordance with some embodiments.
Figure 14:
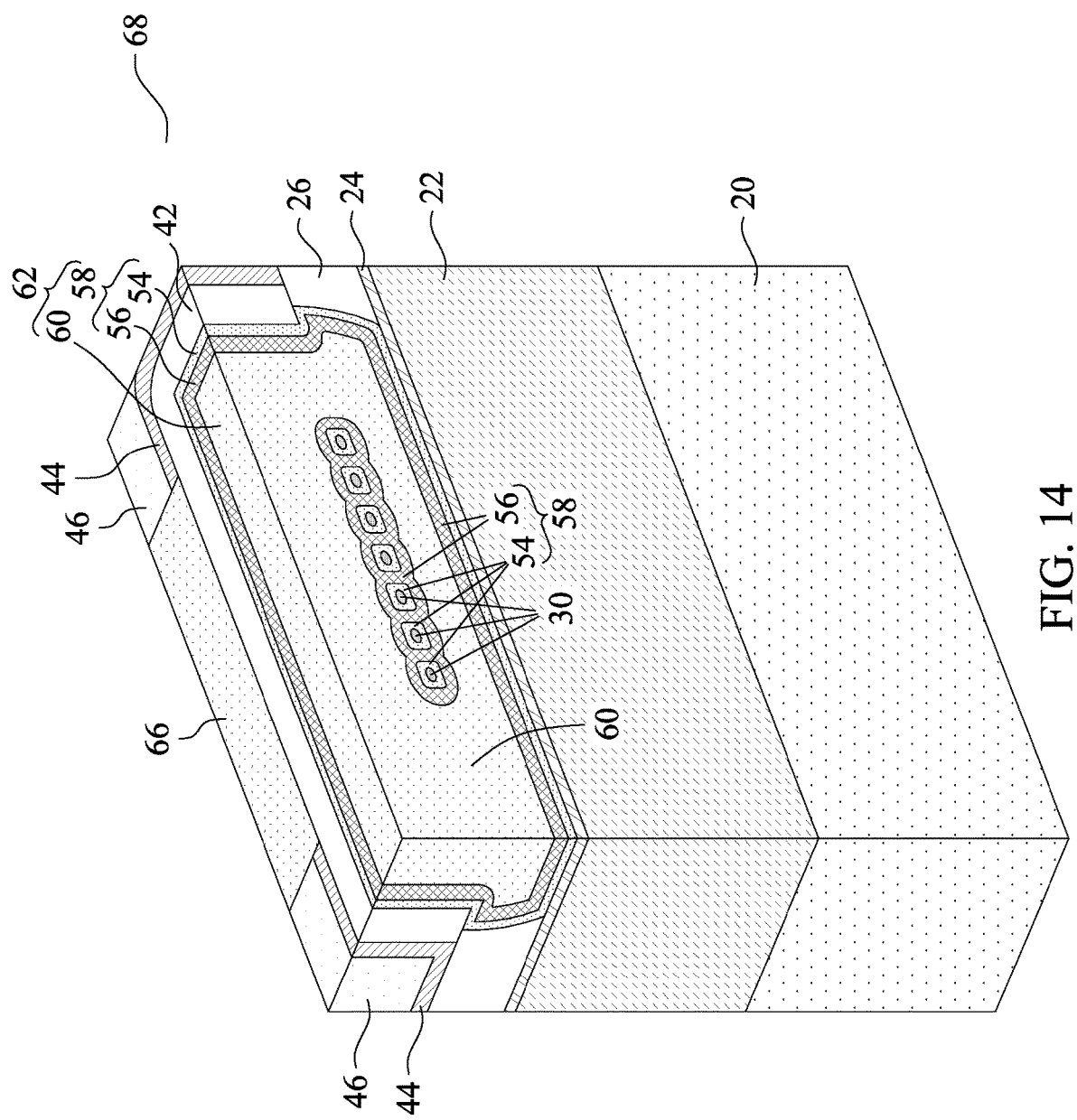
FIG. 14 illustrates a perspective view of a cross-section of carbon nanotubes and a corresponding gate stack in accordance with some embodiments.

FIG. 13 illustrates a perspective view of nanotube transistors 68A and 68B, which share common gate stacks 62. An internal structure of one of gate stacks 62 is illustrated. As shown in FIG. 13, gate electrode 60 encircles the combined region including carbon nanotubes 30 and gate dielectric 58. The parts of gate electrode 60 on the left and right sides of the combined region have smaller channel-control on carbon nanotubes 30 since gate dielectric 58 is farther away from most of the carbon nanotubes 30. The parts of gate electrode 60 on the top and bottom sides of the combined region have effective channel-control on carbon nanotubes 30. Accordingly, transistors 68A and 68B (68) are referred to as double-gate nanotube transistors, with the term "double-gate" referring to the top gate and the bottom gate. FIG. 14 illustrates a similar structure as FIG. 13, except that both of a cross-section in the gate-length direction and a cross-section in the gate-width direction are revealed, so that the shape of the components in gate stacks in two cross-sections may be viewed clearly.

Figure 15:
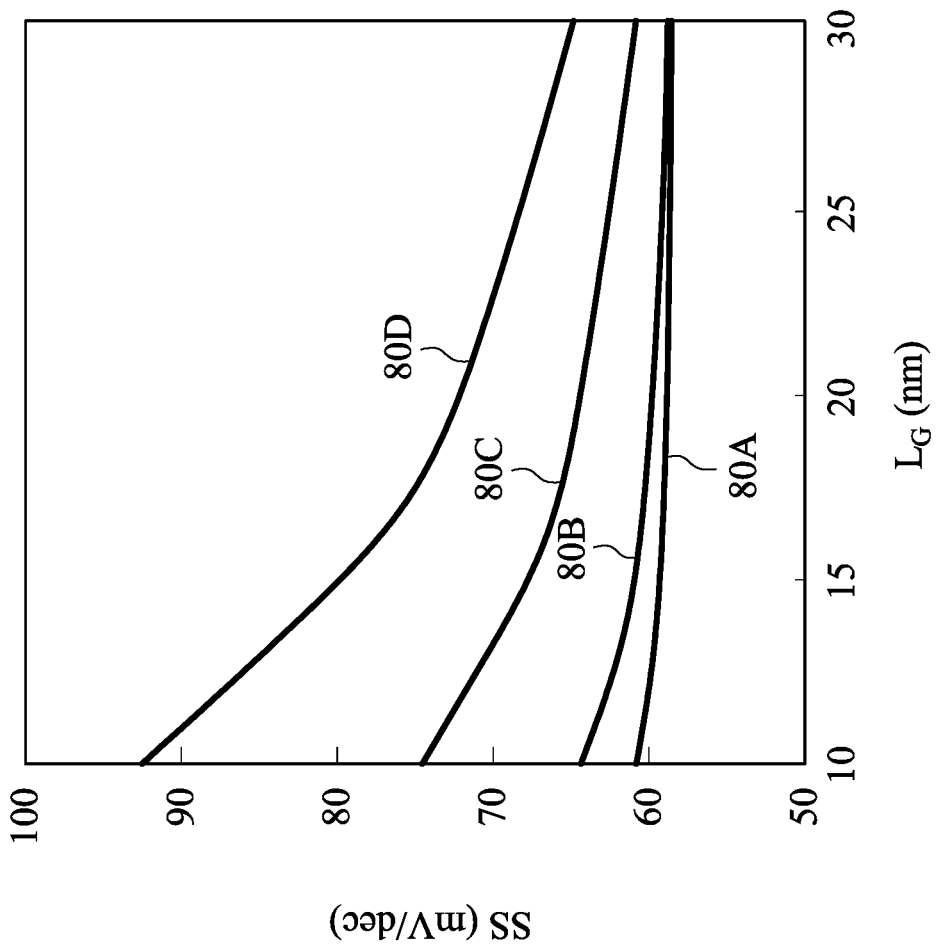
FIG. 15 illustrates the Subthreshold Swing (SS) of various types of transistors as functions of gate lengths in accordance with some embodiments.

FIG. 15 illustrates the simulated Subthreshold Swing (SS) of various types of transistors as functions of gate lengths $L_G$. Lines 80A, 80B, 80C, and 80D illustrate the simulation results obtained from a Gate-All-Around (GAA) nanotube transistor, a double-gate nanotube transistor, a top-gate nanotube transistor, and a bottom-gate nanotube transistor, respectively. The double-gate nanotube transistor (line 80B) is simulated based on the embodiments of the present disclosure. The results revealed that the double-gate nanotube transistor has the desirable low subthreshold swing, which is significantly better than the top-gate nanotube transistor and the bottom-gate nanotube transistor, and is close to the subthreshold swing of the GAA nanotube transistor. For example, the subthreshold swing of the double-gate nanotube transistor may be as small as 61 mV/dec, while the subthreshold swing of the top-gate nanotube transistor is about 70 mV/dec. Also, with the reduction of the gate length $L_G$, the increase in the subthreshold swing of the double-gate nanotube transistor is very small, indicating that the double-gate nanotube transistor has good scaling ability and low short-channel effect. In addition to the results as shown in FIG. 15, the Drain-Induced Barrier Lowering (DIBL) of the double-gate nanotube transistor may be as small as 17 mV/V, while the DIBL of the top-gate nanotube transistor is about 51 mV/V, also indicating that the short-channel effect of the double-gate nanotube transistor is far lower that of the top-gate nanotube transistor.

Figure 16:
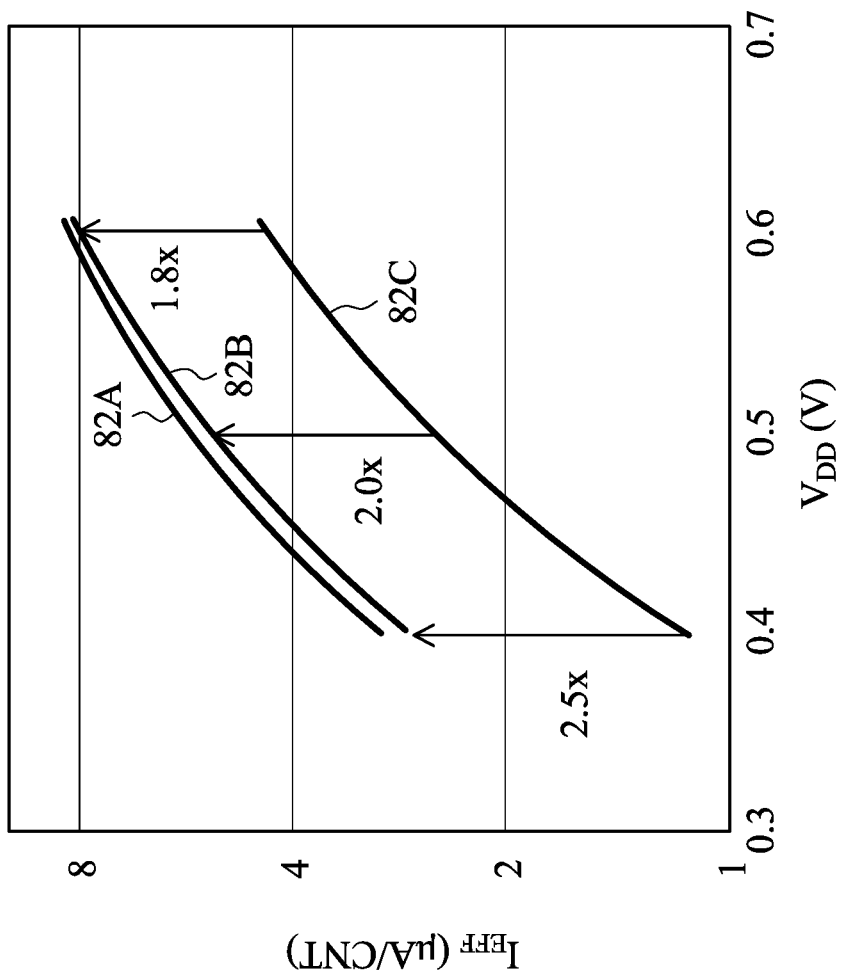
FIG. 16 illustrates the effective drive current of various types of transistors as functions of gate lengths in accordance with some embodiments.

FIG. 16 illustrates the effective drive current $I_{eff}$ of various types of transistors as functions of power supply voltages VDD. Lines 82A, 82B, and 82C illustrate the simulation results obtained from a GAA nanotube transistor, a double-gate nanotube transistor, and a top-gate nanotube transistor, respectively. The results revealed that the effective drive current of the double-gate nanotube transistor is far superior (between about 1.8 times and about 2.5 times) over that of the top-gate nanotube transistor (especially at low $V_{DD}$ voltages), and is close to the effective drive current of the GAA transistor.

The embodiments of the present disclosure have some advantageous features. Double-gate nanotube transistors have reduced short-channel effect over that of top-gate nanotube and bottom-gate nanotube transistors, and the short-channel effect of the double-gate nanotube transistors is close to that of GAA nanotube transistors. Also, comparing to GAA nanotube transistors, the carbon nanotubes of the double-gate nanotube transistors may be located closer to each other since the double-gate nanotube transistors do not need to provide space for gate electrode to separate carbon nanotubes, and hence in a unit chip area, the number of carbon nanotubes, hence the drive current, is increased over that of GAA transistors.

In accordance with some embodiments of the present disclosure, a method comprises depositing a dielectric layer over a substrate; forming carbon nanotubes on the dielectric layer; forming a dummy gate stack on the carbon nanotubes; forming gate spacers on opposing sides of the dummy gate stack; removing the dummy gate stack to form a trench between the gate spacers, wherein the carbon nanotubes are exposed to the trench; etching a portion of the dielectric layer underlying the carbon nanotubes, wherein the carbon nanotubes are suspended; forming a replacement gate dielectric surrounding the carbon nanotubes; and forming a gate electrode surrounding the replacement gate dielectric. In an embodiment, the forming the replacement gate dielectric comprises: depositing an interfacial layer encircling the carbon nanotubes, wherein portions of the interfacial layer encircling different ones of the carbon nanotubes are joined to form a continuous interfacial layer; and depositing a high-k dielectric layer encircling the interfacial layer. In an embodiment, the forming the replacement gate dielectric comprises: depositing an interfacial layer encircling the carbon nanotubes; and depositing a high-k dielectric layer encircling the interfacial layer, wherein portions of the interfacial layer encircling different ones of the carbon nanotubes are physically separated from each other by the high-k dielectric layer. In an embodiment, the forming the carbon nanotubes comprises transferring the carbon nanotubes onto the dielectric layer. In an embodiment, the method further comprises depositing an isolation layer over the substrate; and depositing an etch stop layer over the isolation layer, wherein the dielectric layer is deposited over and contacting the etch stop layer, and wherein the etching the portion of the dielectric layer is stopped on the etch stop layer. In an embodiment, the method further comprises forming a contact etch stop layer extending on sidewalls of the gate spacers, wherein the contact etch stop layer is further over and contacting the carbon nanotubes; and forming an inter-layer dielectric over the contact etch stop layer. In an embodiment, the method further comprises etching-through the inter-layer dielectric and the contact etch stop layer to form a contact opening, wherein portions of the carbon nanotubes are revealed to the contact opening; and forming a source/drain contact plug in the contact opening. In an embodiment, the removing the dummy gate stack to form the trench comprises an isotropic etching process. In an embodiment, the etching the portion of the dielectric layer underlying the carbon nanotubes comprises an isotropic etching process.

In accordance with some embodiments of the present disclosure, a device comprises a dielectric layer over a substrate; a plurality of carbon nanotubes over and contacting a first portion and a second portion of the dielectric layer; a gate stack extending between the first portion and the second portion of the dielectric layer, wherein the gate stack comprises: a gate dielectric encircling portions of the plurality of carbon nanotubes, wherein the portions of the plurality of carbon nanotubes are between the first portion and the second portion of the dielectric layer; and a gate electrode surrounding a combined region of the plurality of carbon nanotubes and the gate dielectric, wherein the gate electrode comprises an upper portion overlapping the combined region, and a lower portion overlapped by the combined region. In an embodiment, the device further comprises an etch stop layer comprising a part underlying and contacting the gate stack, wherein the etch stop layer further extends directly underlying the first portion and the second portion of the dielectric layer. In an embodiment, the substrate is a semiconductor substrate, and the device further comprises: an isolation layer underlying the etch stop layer, wherein the isolation layer is further over and contacting the semiconductor substrate. In an embodiment, the gate dielectric comprises an interfacial layer encircling the plurality of carbon nanotubes, and a high-k dielectric layer encircling the interfacial layer, and wherein portions of the interfacial layer encircling different ones of the carbon nanotubes are physically joined. In an embodiment, the gate dielectric comprises an interfacial layer encircling the plurality of carbon nanotubes, and a high-k dielectric layer encircling the interfacial layer, and wherein portions of the interfacial layer encircling different ones of the carbon nanotubes are physically separated from each other by the high-k dielectric layer. In an embodiment, the device further comprises gate spacers on opposing sides of a top portion the gate stack, wherein the gate stack further comprises a bottom portion extending lower than bottom surfaces of the gate spacers. In an embodiment, the gate stack comprises a planar bottom surface; and curved sidewalls connecting to opposite ends of the planar bottom surface.

In accordance with some embodiments of the present disclosure, a device comprises a substrate comprising a top surface; a plurality of carbon nanotubes substantially parallel to and spaced apart from each other, wherein the plurality of carbon nanotubes are substantially aligned to a same plane that is over and parallel to the top surface of the substrate; a gate stack comprising a gate dielectric comprising a first portion directly over the plurality of carbon nanotubes, and a second portion directly under the plurality of carbon nanotubes; and a gate electrode comprising a third portion over the first portion of the gate dielectric, and a fourth portion under the second portion of the gate dielectric; and a gate spacer on a sidewall of the gate stack, wherein the first portion of the gate dielectric and the third portion of the gate electrode extend higher than a bottom surface of the gate spacer, and the second portion of the gate dielectric and the fourth portion of the gate electrode extend lower than the bottom surface of the gate spacer. In an embodiment, the gate electrode fully encircles the gate dielectric. In an embodiment, the device further comprises a dielectric layer underlying and contacting the gate spacer, wherein the plurality of carbon nanotubes further extends between the gate spacer and the dielectric layer. In an embodiment, a bottom portion of the gate stack extends directly underlying the gate spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
depositing an isolation layer over a substrate;
depositing an etch stop layer over the isolation layer;
depositing a dielectric layer over the etch stop layer;
forming carbon nanotubes on the dielectric layer;
forming a dummy gate stack on the carbon nanotubes;
forming gate spacers on opposing sides of the dummy gate stack;
removing the dummy gate stack to form a trench between the gate spacers, wherein the carbon nanotubes are exposed to the trench;
etching a portion of the dielectric layer underlying the carbon nanotubes, wherein the etching the portion of the dielectric layer is stopped on the etch stop layer, and wherein the carbon nanotubes are suspended;
forming a replacement gate dielectric surrounding the carbon nanotubes; and
forming a gate electrode surrounding the replacement gate dielectric.

2. The method of claim 1, wherein the forming the replacement gate dielectric comprises:
depositing an interfacial layer encircling the carbon nanotubes, wherein portions of the interfacial layer encircling different ones of the carbon nanotubes are joined to form a continuous interfacial layer; and
depositing a high-k dielectric layer encircling the interfacial layer.

3. The method of claim 1, wherein the forming the replacement gate dielectric comprises:
depositing an interfacial layer encircling the carbon nanotubes; and
depositing a high-k dielectric layer encircling the interfacial layer, wherein portions of the interfacial layer encircling different ones of the carbon nanotubes are physically separated from each other by the high-k dielectric layer.

4. The method of claim 1, wherein the forming the carbon nanotubes comprises transferring the carbon nanotubes onto the dielectric layer.

5. The method of claim 1 further comprising:
forming a contact etch stop layer extending on sidewalls of the gate spacers, wherein the contact etch stop layer is further over and contacting the carbon nanotubes; and
forming an inter-layer dielectric over the contact etch stop layer.

6. The method of claim 5 further comprising:
etching through the inter-layer dielectric and the contact etch stop layer to form a contact opening, wherein portions of the carbon nanotubes are revealed to the contact opening; and
forming a source/drain contact plug in the contact opening.

7. The method of claim 1, wherein the removing the dummy gate stack to form the trench comprises an isotropic etching process.

8. The method of claim 1, wherein the etching the portion of the dielectric layer underlying the carbon nanotubes comprises an isotropic etching process.

9. A method comprising:
forming an isolation layer over and contacting a semiconductor substrate;
forming an etch stop layer over the isolation layer;
forming a dielectric layer over the etch stop layer;
forming a plurality of carbon nanotubes over and contacting a first portion and a second portion of the dielectric layer;
forming a dummy gate stack over the dielectric layer and the plurality of carbon nanotubes;
removing the dummy gate stack through etching to reveal the plurality of carbon nanotubes, wherein the etching stops on the etch stop layer;
forming a gate stack extending into a space left by the dummy gate stack that has been removed, wherein the gate stack further extends between the first portion and the second portion of the dielectric layer, wherein the gate stack comprises:
a gate dielectric encircling portions of the plurality of carbon nanotubes, wherein the portions of the plurality of carbon nanotubes are between the first portion and the second portion of the dielectric layer; and
a gate electrode surrounding a combined region of the plurality of carbon nanotubes and the gate dielectric, wherein the gate electrode comprises an upper portion overlapping the combined region, and a lower portion overlapped by the combined region.

10. The method of claim 9 further comprising etching some portions of the dielectric layer underlying the plurality of carbon nanotubes, so the plurality of carbon nanotubes are suspended.

11. The method of claim 9, wherein the gate dielectric comprises an interfacial layer encircling the plurality of carbon nanotubes, and a high-k dielectric layer encircling the interfacial layer, and wherein portions of the interfacial layer encircling different ones of the carbon nanotubes are physically joined.

12. The method of claim 9 further comprising:
forming gate spacers, wherein the gate spacers are on opposing sides of a top portion of the gate stack, and wherein the gate stack further comprises a bottom portion extending lower than bottom surfaces of the gate spacers.

13. The method of claim 9, wherein the gate stack comprises:
a planar bottom surface; and
curved sidewalls connecting to opposite ends of the planar bottom surface.

14. A method comprising:
forming a plurality of carbon nanotubes substantially parallel to and spaced apart from each other, wherein the plurality of carbon nanotubes are substantially aligned to a same plane that is over and in physical contact with a top surface of a dielectric layer;
etching the dielectric layer to remove a portion of the dielectric layer directly underlying and overlapped by the plurality of carbon nanotubes;
forming a gate stack comprising:
a gate dielectric comprising a first portion directly over the plurality of carbon nanotubes, and a second portion directly under the plurality of carbon nanotubes; and
a gate electrode comprising a third portion over the first portion of the gate dielectric, and a fourth portion under the second portion of the gate dielectric;
forming a gate spacer, wherein sidewalls of the gate stack and the gate spacer are in contact with each other, wherein the first portion of the gate dielectric and the third portion of the gate electrode extend higher than a bottom surface of the gate spacer, and the second portion of the gate dielectric and the fourth portion of the gate electrode extend lower than the bottom surface of the gate spacer;
forming a contact etch stop layer extending on a sidewall of the gate spacer, wherein the contact etch stop layer is further over and contacting the carbon nanotubes; and
forming an inter-layer dielectric over the contact etch stop layer.

15. The method of claim 14, wherein the gate electrode fully encircles the gate dielectric.

16. The method of claim 14, wherein after the portion of the dielectric layer is removed by the etching the dielectric layer, a void is formed to encircle portions of the plurality of carbon nanotubes that were in physical contact with the dielectric layer.

17. The method of claim 14, wherein a bottom portion of the gate stack extends directly underlying the gate spacer.

18. The method of claim 14 further comprising:
etching the inter-layer dielectric and the contact etch stop layer to form a contact opening, wherein portions of the carbon nanotubes are revealed to the contact opening; and
forming a source/drain contact plug in the contact opening.

19. The method of claim 18, wherein the etching the contact etch stop layer stops on the dielectric layer.

20. The method of claim 14, wherein each of the plurality of carbon nanotubes is separated from other ones of the plurality of carbon nanotubes by portions of the gate dielectric.

* * * * *